(12) United States Patent
Jiang

(10) Patent No.: US 10,332,988 B2
(45) Date of Patent: Jun. 25, 2019

(54) BACK-CHANNEL-ETCHED TFT SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Chunsheng Jiang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/749,096

(22) PCT Filed: Dec. 20, 2017

(86) PCT No.: PCT/CN2017/117321
§ 371 (c)(1),
(2) Date: Jan. 30, 2018

(65) Prior Publication Data
US 2019/0157430 A1  May 23, 2019

(30) Foreign Application Priority Data

Nov. 21, 2017  (CN) .......................... 2017 1 1167354

(51) Int. Cl.
*H01L 27/12* (2006.01)
*H01L 29/45* (2006.01)
(Continued)

(52) U.S. Cl.
CPC .... *H01L 29/66969* (2013.01); *H01L 21/3213* (2013.01); *H01L 27/1203* (2013.01);
(Continued)

(58) Field of Classification Search
CPC ........... H01L 29/4908; H01L 29/42384; H01L 29/41733; H01L 29/66742; H01L 29/786;
(Continued)

(56) References Cited

U.S. PATENT DOCUMENTS

2008/0023703 A1* 1/2008 Hoffman ............. H01L 29/7869
257/59
2013/0009219 A1* 1/2013 Yamazaki ........... H01L 29/7869
257/288

(Continued)

*Primary Examiner* — Ngan V Ngo
(74) *Attorney, Agent, or Firm* — Leong C. Lei

(57) ABSTRACT

The invention provides a BCE TFT substrate and manufacturing method thereof. The method uses low deposition power and low oxygen content to deposit first silicon oxide thin film; then increases deposition power with low oxygen content to deposit second silicon oxide thin film. The first and second silicon oxide thin films form a passivation layer; the second silicon oxide film is implanted with oxygen to form a superficial layer so that the Si:O atomic ratio in the superficial layer is close to or same as Si:O atomic ratio of $SiO_2$, to ensure the passivation layer in contact with the air side is strongly hydrophobic to prevent outside water vapor into the back-channel, while ensuring the side of passivation layer contacting IGZO active layer has a lower oxygen content to reduce the probability of forming unbalanced O-ions at the interface between passivation layer and IGZO active layer.

6 Claims, 3 Drawing Sheets

(51) Int. Cl.
*H01L 29/49* (2006.01)
*H01L 29/66* (2006.01)
*H01L 29/417* (2006.01)
*H01L 29/423* (2006.01)
*H01L 29/786* (2006.01)
*H01L 21/3213* (2006.01)

(52) U.S. Cl.
CPC ...... *H01L 27/1214* (2013.01); *H01L 27/1251* (2013.01); *H01L 27/1262* (2013.01); *H01L 29/41733* (2013.01); *H01L 29/42384* (2013.01); *H01L 29/45* (2013.01); *H01L 29/4908* (2013.01); *H01L 29/66742* (2013.01); *H01L 29/786* (2013.01)

(58) Field of Classification Search
CPC ............. H01L 27/1251; H01L 27/1203; H01L 27/1214; H01L 21/02274; H01L 21/28556
See application file for complete search history.

(56) References Cited

U.S. PATENT DOCUMENTS

| | | | |
|---|---|---|---|
| 2014/0138675 A1* | 5/2014 | Yamazaki | H01L 29/66757 257/43 |
| 2015/0214376 A1* | 7/2015 | Koezuka | G02F 1/1368 257/43 |
| 2016/0079089 A1* | 3/2016 | Koezuka | H01L 21/477 438/104 |
| 2017/0330938 A1* | 11/2017 | Baeck | H01L 27/1225 |
| 2018/0366588 A1* | 12/2018 | Yamazaki | H01L 29/7869 |

* cited by examiner

BACK-CHANNEL-ETCHED TFT SUBSTRATE AND MANUFACTURING METHOD THEREOF

BACKGROUND OF THE INVENTION

1. Field of the Invention

The present invention relates to the field of display techniques, and in particular to a back-channel-etched thin film transistor (TFT) substrate and manufacturing method thereof.

2. The Related Arts

The liquid crystal display (LCD) provides advantages of thinness, low power-consumption and no radiation, and is widely used in, such as, LCD televisions, mobile phones, personal digital assistants (PDAs), digital cameras, computer screens, laptop screens, and so on.

The organic light-emitting diode (OLED) display device, also called organic electroluminescent display, is a new type of panel display device. Because the OLED display device provides the advantages of simple manufacturing process, low cost, low power consumption, high luminous efficiency, wide temperature range operation, thinness and lightness, short response time, ability to achieve color display and large-screen display, easy to realize matching with IC driver, and easy to realize flexible display, and is thus recognized as the most promising display device in the industry.

The OLED display can be classified into passive matrix OLED (PMOLED) and active matrix OLED (AMOLED) according to the driving mode, that is, the direct addressing and the thin film transistor (TFT) array addressing two categories. Among them, AMOLED has a pixel array, is an active display type, high luminous efficiency, and usually used for high-definition large-size display device.

The thin film transistor (TFT) is the main driving element in the LCD and AMOLED display device, and is directly related to the development trend of the high-performance panel display. The TFT has many types of structures, and can be manufactured in various materials. The amorphous silicon (a-Si) is the more common used material.

As the LCD and AMOLED display device develop towards the large-size and high-resolution, the only about 1 $cm^2/(Vs)$ mobility of the conventional a-Si has been unable to meet the requirements, while the metal oxide material, such as, indium gallium zinc oxide (IGZO) with the more than 10 $cm^2/(Vs)$ mobility, and the corresponding TFT fabrication compatibility with existing production line of a-Si semiconductors, has rapidly become the focus of research and development in recent years.

Compared to the conventional a-Si TFT, IGZO TFT provides the following advantages:

1. Improve the resolution of the display backplane: under the premise of guaranteeing the same transmittance, IGZO TFT display backplane resolution can be done more than 2 times of the a-Si TFT, as the carrier concentration of IGZO material is high and the mobility is high so as to reduce the size of the TFT, to ensure resolution improvement;

2. Reduce the energy consumption of the display device: compared to a-Si TFT and LTPS TFT, the leakage current of the IGZO TFT is less than 1 pA; the driving frequency is reduced from the original 30-50 Hz to 2-5 Hz, and can even reach 1 Hz through special process. Although the number of TFT driving times is reduced, the number still maintains the alignment of the LC molecules without affecting the quality of the image. As such, the power consumption of the display backplane is reduced. In addition, the high mobility of the IGZO semiconductor material enables the smaller size TFTs to provide sufficient charging ability and higher capacitance, and also improves the aperture ratio of the liquid crystal panel, the effective area of light penetration becomes larger, the same brightness can be achieved with fewer backplane components or low power consumption, and the energy consumption can be reduced;

3. by using intermittent driving, the influence of the noise of the LCD driving circuit on the touch screen detection circuit can be reduced, the higher sensitivity can be achieved, and even the tip of the ballpoint pen tip can respond. Moreover, the power can be cut off as the screen is not updated; therefore, the performance on the energy-saving performance is better.

Currently, the TFT with IGZO as semiconductor active layer generally adopts an etch stop layer (ESL) structure. The ESL can effectively protect the IGZO from being affected in the source/drain etching process, to ensure that TFT has excellent semiconductor properties. However, the manufacturing process of IGZO TFT with ESL structure is complicated and requires six photolithography processes, which is disabling for cost reduction. Therefore, the development of IGZO TFT with a back-channel-etched (BCE) structure with less photolithography processes is generally pursued.

After manufacturing, the BCE-structured IGZO TFT has two balances: the first balance is $H_2O$ decomposition of electrons and polar water molecules; the second balance is unbalanced O-ions to obtain electrons to form electronic trap state. When any one balance is destroyed, the performance of the TFT device will be affected. For the first balance, as the $H_2O$ in the air on the surface of the passivation layer increases, the balance moves toward the $H_2O$ decomposition and electrons and polar water molecules increase. For the N-type electron conducting TFT device, the semiconductor characteristic curve shifts in the negative direction and the device performance is affected. For the second balance, when the oxygen content of the passivation layer and the IGZO active layer interface is too high, the unbalanced O-ions are formed, the balance moves towards the formation of electron traps and capture electrons. For the N-type electron conducting TFT device, the semiconductor characteristic curve shifts in the positive direction and the device performance is affected.

SUMMARY OF THE INVENTION

The object of the present invention is to provide a manufacturing method of the back-channel-etched (BCE) TFT substrate, able to ensure that the side of the passivation layer in contact with the air is more hydrophobic and prevents the outside water from entering the back-channel while ensuring that the side of the passivation layer in contact with the IGOZ active layer has a lower oxygen content and reduces the probability of forming unbalanced O-ion at the interface of the passivation layer and the IGZO active layer, at the same time to prevent the source and drain from oxidization, to ensure stable device performance.

Another object of the present invention is to provide a BCE TFT substrate, with stronger device stability.

To achieve the above object, the present invention provides a manufacturing method of back-channel-etched TFT substrate, comprising:

providing a base substrate, forming on the base substrate from bottom to top, a gate, a gate insulating layer, and an active layer, and forming a source and a drain separated with interval on the active layer;

depositing a first silicon oxide thin film on the source, the drain, and the active layer by a plasma enhanced chemical vapor deposition process, depositing a second silicon oxide thin film on the first silicon oxide film, Si:O atomic ratios in the first silicon oxide thin film and the second silicon oxide thin film both being the same and equal to 1:X, wherein X being less than 2; the first silicon oxide thin film and the second silicon oxide thin film forming a passivation layer;

implanting oxygen into a superficial layer of the second silicon oxide thin film by ion implantation so that Si:O atomic ratio in the superficial layer of the second silicon oxide thin film being close to or the same as Si:O atomic ratio in $SiO_2$; that is, the Si:O atomic ratio in the superficial layer of the second silicon oxide thin film is 1:Y, with Y between 1.8 and 2, and Y greater than X, to form a back-channel-etched TFT substrate.

According to a preferred embodiment of the present invention, when depositing the first silicon oxide thin film and the second silicon oxide thin film by the plasma enhanced chemical vapor deposition process, the deposition power of the second silicon oxide thin film is greater than the deposition power of the first silicon oxide thin film so that bond angle of Si—O—Si bond in the second silicon oxide thin film is smaller than bond angle of Si—O—Si bond in the first silicon oxide thin film and the second silicon oxide thin film is more hydrophobic the first silicon oxide thin film.

According to a preferred embodiment of the present invention, the superficial layer of the second silicon oxide thin film is more hydrophobic than other remaining regions of the second silicon oxide thin film, and the other remaining regions of the second silicon oxide thin film is more hydrophobic than the first silicon oxide thin film.

According to a preferred embodiment of the present invention, the second silicon oxide thin film is thicker than the first silicon oxide thin film.

According to a preferred embodiment of the present invention, the first silicon oxide thin film has a thickness of 1000 Å, and the second silicon oxide thin film has a thickness of 2000 Å.

The present invention also provides a back-channel-etched TFT substrate, comprising: a base substrate, a gate disposed on the base substrate, a gate insulating layer disposed on the gate, an active layer disposed on the gate insulating layer, a source and a drain separated with interval on the active layer, and a passivation layer disposed on the source, the drain, and the active layer;

the passivation layer comprising a first silicon oxide thin film disposed on the source, the drain, and the active layer, and a second silicon oxide thin film disposed on the first silicon oxide thin film; Si:O atomic ratio in a superficial layer of the second silicon oxide thin film being close to or the same as Si:O atomic ratio in $SiO_2$; that is, the Si:O atomic ratio in the superficial layer of the second silicon oxide thin film being 1:Y, with Y between 1.8 and 2, and Y greater than X; the Si:O atomic ratios in other remaining regions of the second silicon oxide thin film except the superficial layer and the first silicon oxide thin film both being the same and equal to 1:X, wherein X being less than Y.

According to a preferred embodiment of the present invention, bond angle of Si—O—Si bond in the second silicon oxide thin film is smaller than bond angle of Si—O—Si bond in the first silicon oxide thin film and the second silicon oxide thin film is more hydrophobic the first silicon oxide thin film.

According to a preferred embodiment of the present invention, the superficial layer of the second silicon oxide thin film is more hydrophobic than the other remaining regions of the second silicon oxide thin film, and the other remaining regions of the second silicon oxide thin film is more hydrophobic than the first silicon oxide thin film.

According to a preferred embodiment of the present invention, the second silicon oxide thin film is thicker than the first silicon oxide thin film.

According to a preferred embodiment of the present invention, the first silicon oxide thin film has a thickness of 1000 Å, and the second silicon oxide thin film has a thickness of 2000 Å.

The present invention also provides a manufacturing method of back-channel-etched TFT substrate, comprising:

providing a base substrate, forming on the base substrate from bottom to top, a gate, a gate insulating layer, and an active layer, and forming a source and a drain separated with interval on the active layer;

depositing a first silicon oxide thin film on the source, the drain, and the active layer by a plasma enhanced chemical vapor deposition process, depositing a second silicon oxide thin film on the first silicon oxide film, Si:O atomic ratios in the first silicon oxide thin film and the second silicon oxide thin film both being the same and equal to 1:X, wherein X being less than 2; the first silicon oxide thin film and the second silicon oxide thin film forming a passivation layer;

implanting oxygen into a superficial layer of the second silicon oxide thin film by ion implantation so that Si:O atomic ratio in the superficial layer of the second silicon oxide thin film being close to or the same as Si:O atomic ratio in $SiO_2$; that is, the Si:O atomic ratio in the superficial layer of the second silicon oxide thin film is 1:Y, with Y between 1.8 and 2, and Y greater than X, to form a back-channel-etched TFT substrate;

wherein when depositing the first silicon oxide thin film and the second silicon oxide thin film by the plasma enhanced chemical vapor deposition process, the deposition power of the second silicon oxide thin film being greater than the deposition power of the first silicon oxide thin film so that bond angle of Si—O—Si bond in the second silicon oxide thin film being smaller than bond angle of Si—O—Si bond in the first silicon oxide thin film and the second silicon oxide thin film being more hydrophobic the first silicon oxide thin film.

wherein the superficial layer of the second silicon oxide thin film being more hydrophobic than other remaining regions of the second silicon oxide thin film, and the other remaining regions of the second silicon oxide thin film being more hydrophobic than the first silicon oxide thin film;

wherein the second silicon oxide thin film being thicker than the first silicon oxide thin film;

wherein the first silicon oxide thin film having a thickness of 1000 Å, and the second silicon oxide thin film having a thickness of 2000 Å.

The present invention provides the following advantages. The manufacturing method of BCE TFT substrate of the present invention uses low deposition power and low oxygen content to deposit a first silicon oxide thin film and then increases the deposition power and maintains a low oxygen content to deposit a second silicon oxide thin film on the first silicon oxide thin film. The first and second silicon oxide thin films form a passivation layer, and finally, the second silicon oxide film is implanted with oxygen by an ion implantation process to form a superficial layer so that the Si:O atomic ratio in the superficial layer is close to or same as Si:O atomic ratio of SiO2, to ensure that the passivation layer in contact with the air side is strongly hydrophobic to prevent outside water vapor into the back-channel, while ensuring that the side of passivation layer contacting IGZO active layer has a lower oxygen content to reduce the probability of forming unbalanced O-ions at the interface between the passivation layer and the IGZO active layer, and at the same time prevents the source and drain from being oxidized to ensure stable device performance. The BCE TFT substrate of the invention is prepared by the above method, and has strong device stability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
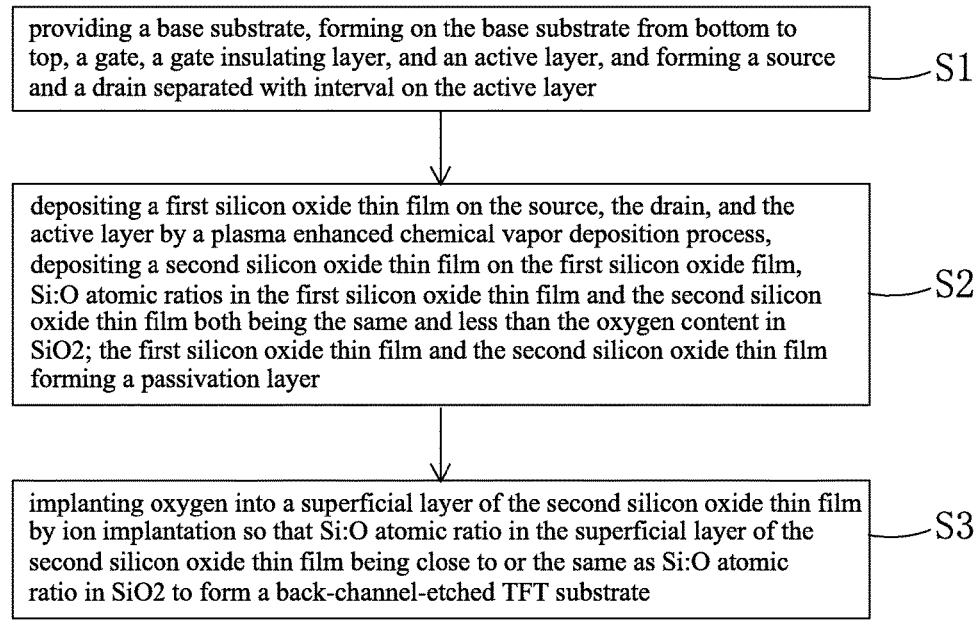
FIG. 1 is a schematic view showing a flowchart of the manufacturing method of BCE TFT substrate provided by an embodiment of the present invention.
Figure 2:
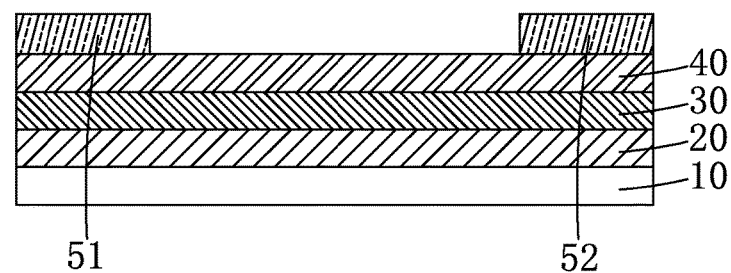
FIG. 2 is a schematic view showing Step S1 of the manufacturing method of the BCE TFT substrate provided by an embodiment of the present invention.

Referring to FIG. 1, the present invention provides a manufacturing method of back-channel-etched TFT substrate, comprising:

Step S1: as shown in FIG. 2, providing a base substrate 10, forming on the base substrate 10 from bottom to top, a gate 20, a gate insulating layer 30, and an active layer 40, and forming a source 51 and a drain 52 separated with interval on the active layer 40.

Specifically, the material of the gate insulating layer 30 comprises $SiO_x$; the material of the active layer 40 comprises IGZO; and the material of the source 51 and the drain 52 comprises Cu.

Figure 3:
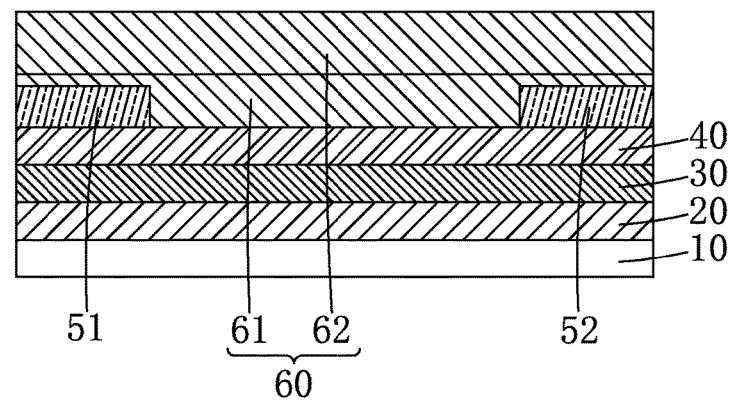
FIG. 3 is a schematic view showing Step S2 of the manufacturing method of the BCE TFT substrate provided by an embodiment of the present invention.

Step S2: as shown in FIG. 3, depositing a first silicon oxide thin film 61 on the source 51, the drain 52, and the active layer 40 by a plasma enhanced chemical vapor deposition (PECVD) process, depositing a second silicon oxide thin film 62 on the first silicon oxide film 61, Si:O atomic ratios in the first silicon oxide thin film 61 and the second silicon oxide thin film 62 both being the same and equal to 1:X, wherein X being less than 2; the first silicon oxide thin film 61 and the second silicon oxide thin film 62 forming a passivation layer 60.

Specifically, when depositing the first silicon oxide thin film 61 and the second silicon oxide thin film 62 by the plasma enhanced chemical vapor deposition process, the deposition power of the second silicon oxide thin film 62 is greater than the deposition power of the first silicon oxide thin film 61 so that bond angle of Si—O—Si bond in the second silicon oxide thin film 62 is smaller than bond angle of Si—O—Si bond in the first silicon oxide thin film 61 and the second silicon oxide thin film 62 is more hydrophobic the first silicon oxide thin film 61. The theory behind the above is as follows: as the deposition power of plasma enhanced chemical vapor deposition increases, the vibration absorption peak of Si—O—Si bond in the silicon oxide thin film is blue-shifted, and the bond angle decreases gradually, while the contact angle (hydrophobicity) increases gradually. When the contact angle reaches maximum, the bond angle of Si—O—Si bond in silicon oxide thin film is close to 112°, which is very close to the bond angle of water molecule 105°. When the contact angle of Si—O—Si bond is close to that of water molecule bond angle, the silicon oxide thin film contact angle (hydrophobicity) is the largest.

Specifically, the purpose of depositing the first silicon oxide thin film 61 with lower power is to prevent the surface of the active layer 40 from being damaged by bombarding the active layer 40 with the plasma of high energy.

Specifically, the PECVD process maintains a low oxygen content when depositing the first silicon oxide thin film 61 and the second silicon oxide thin film 62 to ensure the first silicon oxide thin film 61 having a lower oxygen content to reduce the probability of forming unbalanced O-ions at the interface between the first silicon oxide thin film 61 and the IGZO active layer 40 to ensure stable device performance.

Specifically, the second silicon oxide thin film 62 is thicker than the first silicon oxide thin film 61.

Specifically, the first silicon oxide thin film 61 has a thickness of 1000 Å, and the second silicon oxide thin film 62 has a thickness of 2000 Å.

Figure 4:
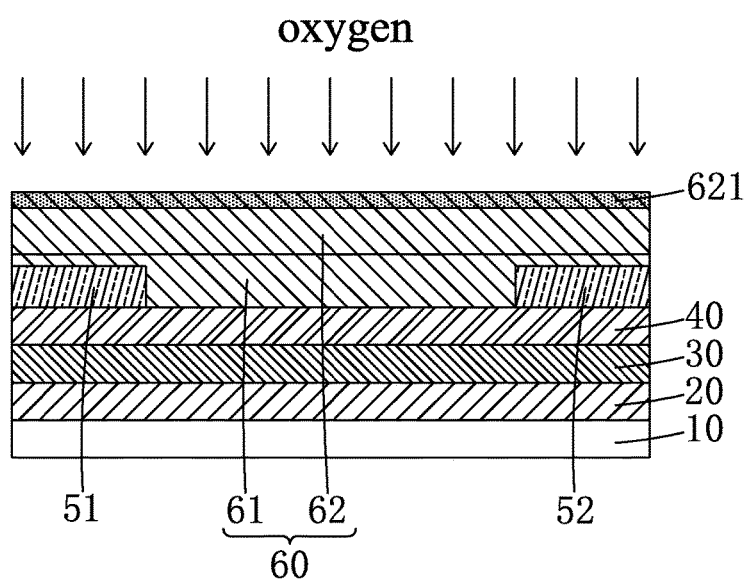
FIG. 4 and FIG. 5 are schematic views showing Step S3 of the manufacturing method of the BCE TFT substrate and FIG. 5 is a schematic view showing the structure of the BCE TFT substrate provided by an embodiment of the present invention.
Figure 5:
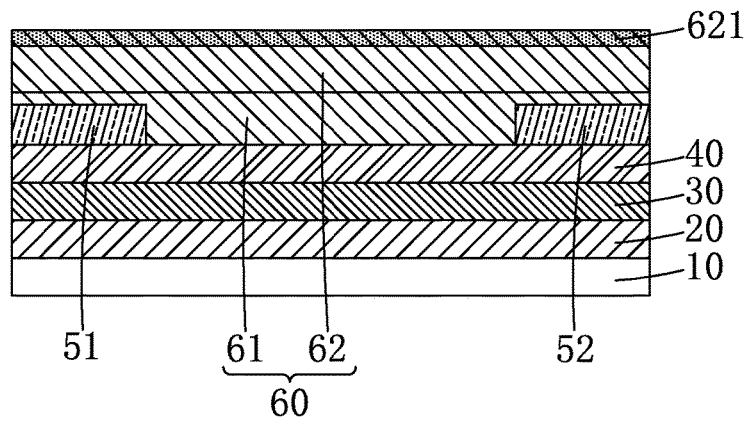

Step S3: as shown in FIG. 4 and FIG. 5, implanting oxygen into a superficial layer 621 of the second silicon oxide thin film 62 by ion implantation so that Si:O atomic ratio in the superficial layer 621 of the second silicon oxide thin film 62 being close to or the same as Si:O atomic ratio in $SiO_2$; that is, the Si:O atomic ratio in the superficial layer 621 of the second silicon oxide thin film 62 is 1:Y, with Y between 1.8 and 2, and Y greater than X, to form a back-channel-etched TFT substrate.

Specifically, before implanting oxygen into the second silicon oxide thin film 62, a large amount of oxygen vacancies are contained in both the first silicon oxide thin film 61 and the second silicon oxide thin film 62. When the water molecules contact the first silicon oxide thin film 61 and the second silicon oxide thin film 62, the water molecules are attracted to the oxygen vacancies so that the first silicon oxide thin film 61 and the second silicon oxide thin film 62 exhibit a certain degree of hydrophilicity.

After implanting the oxygen into the second silicon oxide thin film 62, the Si:O atomic ratio in the superficial layer 621 of the second silicon oxide thin film 62 is close to or the same as the Si:O atomic ratio in $SiO_2$; that is, no or few oxygen vacancies are contained in the superficial layer 621 of the second silicon oxide thin film 62. Lattice oxygen repels when the water molecules contact with the second silicon oxide thin film 62. The superficial layer 621 of the second silicon oxide thin film 62 shows a stronger hydrophobicity and ensures that $H_2O$ in the environment cannot pass through the second silicon oxide thin film 62 to enter the back-channel of the TFT device and prevents the polarity of the water molecules in the environment from affecting the TFT performance. Meanwhile, due to the low oxygen content in the first silicon oxide thin film 61, the probability of forming unbalanced O-ion at the interface of the first silicon oxide thin film 61 and the IGZO active layer 40 is reduced, and at the same time, the source 51 and drain 52 made of copper are prevented from being oxidized and the performance of the manufactured BCE TFT substrate is stable.

Specifically, the superficial layer 621 of the second silicon oxide thin film 62 is more hydrophobic than other remaining regions of the second silicon oxide thin film 62, and the other remaining regions of the second silicon oxide thin film 62 is more hydrophobic than the first silicon oxide thin film 61.

The manufacturing method of BCE TFT substrate of the present invention uses low deposition power and low oxygen content to deposit the first silicon oxide thin film 61 and then increases the deposition power and maintains a low oxygen content to deposit the second silicon oxide thin film 62 on the first silicon oxide thin film 61. The first and second silicon oxide thin films 61, 62 form a passivation layer 60, and finally, the second silicon oxide film 62 is implanted with oxygen by an ion implantation process to form a superficial layer 621 so that the Si:O atomic ratio in the superficial layer 621 is close to or same as Si:O atomic ratio of $SiO_2$, to ensure that the passivation layer 60 in contact with the air side is strongly hydrophobic to prevent outside water vapor into the back-channel, while ensuring that the side of passivation layer 60 contacting IGZO active layer 40 has a lower oxygen content to reduce the probability of forming unbalanced O-ions at the interface between the passivation layer 60 and the IGZO active layer 40, and at the same time prevents the source 51 and drain 52 from being oxidized to ensure stable device performance.

Refer to FIG. 5. Based on the above manufacturing method, the present invention also provides a back-channel-etched TFT substrate, comprising: a base substrate 10, a gate 20 disposed on the base substrate 10, a gate insulating layer 30 disposed on the gate 20, an active layer 40 disposed on the gate insulating layer 30, a source 51 and a drain 52 separated with interval on the active layer 40, and a passivation layer 60 disposed on the source 51, the drain 52, and the active layer 60;

the passivation layer 60 comprising a first silicon oxide thin film 61 disposed on the source 51, the drain 52, and the active layer 40, and a second silicon oxide thin film 62 disposed on the first silicon oxide thin film 61; Si:O atomic ratio in a superficial layer 621 of the second silicon oxide thin film 62 being close to or the same as Si:O atomic ratio in $SiO_2$; that is, the Si:O atomic ratio in the superficial layer 621 of the second silicon oxide thin film 62 being 1:Y, with Y between 1.8 and 2, and Y greater than X; the Si:O atomic ratios in other remaining regions of the second silicon oxide thin film 62 except the superficial layer 621 and the first silicon oxide thin film 61 both being the same and equal to 1:X, wherein X being less than Y.

Specifically, the bond angle of Si—O—Si bond in the second silicon oxide thin film 62 is smaller than bond angle of Si—O—Si bond in the first silicon oxide thin film 61 and the second silicon oxide thin film 62 is more hydrophobic the first silicon oxide thin film 61.

Specifically, because the Si:O atomic ratio in the superficial layer 621 of the second silicon oxide thin film 62 is close to or the same as the Si:O atomic ratio in $SiO_2$, the superficial layer 621 of the second silicon oxide thin film 62 shows a stronger hydrophobicity than other remaining regions of the second silicon oxide thin film 62 and the first silicon oxide thin film 61.

Specifically, the superficial layer 621 of the second silicon oxide thin film 62 is more hydrophobic than the other remaining regions of the second silicon oxide thin film 62, and the other remaining regions of the second silicon oxide thin film 62 is more hydrophobic than the first silicon oxide thin film 61.

Specifically, the material of the gate insulating layer 30 comprises $SiO_x$; the material of the active layer 40 comprises IGZO; and the material of the source 51 and the drain 52 comprises Cu.

Specifically, the second silicon oxide thin film 62 is thicker than the first silicon oxide thin film 61.

Specifically, the first silicon oxide thin film 61 has a thickness of 1000 Å, and the second silicon oxide thin film 62 has a thickness of 2000 Å.

The BCE TFT substrate of the present invention is manufactured by the aforementioned manufacturing method, and the passivation layer 60 comprises the first silicon oxide thin film 61 and the second silicon oxide thin film 62 disposed on the first silicon oxide thin film 61; the Si:O atomic ratio in the superficial layer is close to or same as Si:O atomic ratio of SiO2, and the oxygen content in the first silicon oxide thin film 61 is less than the oxygen content in the second silicon oxide thin film 61, to ensure that the passivation layer 60 in contact with the air side is strongly hydrophobic to prevent outside water vapor into the back-channel, while ensuring that the side of passivation layer 60 contacting IGZO active layer 40 has a lower oxygen content to reduce the probability of forming unbalanced O-ions at the interface between the passivation layer 60 and the IGZO active layer 40, and at the same time prevents the source 51 and drain 52 from being oxidized to ensure stable device performance.

In summary, the present invention provides a BCE TFT substrate and manufacturing method thereof. The manufacturing method of BCE TFT substrate of the present invention uses low deposition power and low oxygen content to deposit a first silicon oxide thin film and then increases the deposition power and maintains a low oxygen content to deposit a second silicon oxide thin film on the first silicon oxide thin film. The first and second silicon oxide thin films form a passivation layer, and finally, the second silicon oxide film is implanted with oxygen by an ion implantation process to form a superficial layer so that the Si:O atomic ratio in the superficial layer is close to or same as Si:O atomic ratio of SiO2, to ensure that the passivation layer in contact with the air side is strongly hydrophobic to prevent outside water vapor into the back-channel, while ensuring that the side of passivation layer contacting IGZO active layer has a lower oxygen content to reduce the probability of forming unbalanced O-ions at the interface between the passivation layer and the IGZO active layer, and at the same time prevents the source and drain from being oxidized to ensure stable device performance. The BCE TFT substrate of the invention is prepared by the above method, and has strong device stability.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of back-channel-etched (BCE) thin film transistor (TFT) substrate, comprising:
   providing a base substrate, forming on the base substrate from bottom to top, a gate, a gate insulating layer, and an active layer, and forming a source and a drain separated with interval on the active layer;
   depositing a first silicon oxide thin film on the source, the drain, and the active layer by a plasma enhanced chemical vapor deposition process, depositing a second silicon oxide thin film on the first silicon oxide film, Si:O atomic ratios in the first silicon oxide thin film and the second silicon oxide thin film both being the same and equal to 1:X, wherein X being less than 2; the first silicon oxide thin film and the second silicon oxide thin film forming a passivation layer;
   implanting oxygen into a superficial layer of the second silicon oxide thin film by ion implantation so that Si:O atomic ratio in the superficial layer of the second silicon oxide thin film being close to or the same as Si:O atomic ratio in $SiO_2$; that is, the Si:O atomic ratio in the superficial layer of the second silicon oxide thin film is 1:Y, with Y between 1.8 and 2, and Y greater than X, to form a back-channel-etched TFT substrate.

2. The manufacturing method of BCE TFT substrate as claimed in claim 1, wherein when depositing the first silicon oxide thin film and the second silicon oxide thin film by the plasma enhanced chemical vapor deposition process, the deposition power of the second silicon oxide thin film is greater than the deposition power of the first silicon oxide thin film so that bond angle of Si—O—Si bond in the second silicon oxide thin film is smaller than bond angle of Si—O—Si bond in the first silicon oxide thin film and the second silicon oxide thin film is more hydrophobic the first silicon oxide thin film.

3. The manufacturing method of BCE TFT substrate as claimed in claim 2, wherein the superficial layer of the second silicon oxide thin film is more hydrophobic than other remaining regions of the second silicon oxide thin film, and the other remaining regions of the second silicon oxide thin film is more hydrophobic than the first silicon oxide thin film.

4. The manufacturing method of BCE TFT substrate as claimed in claim 1, wherein the second silicon oxide thin film is thicker than the first silicon oxide thin film.

5. The manufacturing method of BCE TFT substrate as claimed in claim 4, wherein the first silicon oxide thin film has a thickness of 1000 Å, and the second silicon oxide thin film has a thickness of 2000 Å.

6. A manufacturing method of back-channel-etched (BCE) thin film transistor (TFT) substrate, comprising:
   providing a base substrate, forming on the base substrate from bottom to top, a gate, a gate insulating layer, and an active layer, and forming a source and a drain separated with interval on the active layer;
   depositing a first silicon oxide thin film on the source, the drain, and the active layer by a plasma enhanced chemical vapor deposition process, depositing a second silicon oxide thin film on the first silicon oxide film, Si:O atomic ratios in the first silicon oxide thin film and the second silicon oxide thin film both being the same and equal to 1:X, wherein X being less than 2; the first silicon oxide thin film and the second silicon oxide thin film forming a passivation layer;
   implanting oxygen into a superficial layer of the second silicon oxide thin film by ion implantation so that Si:O atomic ratio in the superficial layer of the second silicon oxide thin film being close to or the same as Si:O atomic ratio in $SiO_2$; that is, the Si:O atomic ratio in the superficial layer of the second silicon oxide thin film is 1:Y, with Y between 1.8 and 2, and Y greater than X, to form a back-channel-etched TFT substrate;
   wherein when depositing the first silicon oxide thin film and the second silicon oxide thin film by the plasma enhanced chemical vapor deposition process, the deposition power of the second silicon oxide thin film being greater than the deposition power of the first silicon oxide thin film so that bond angle of Si—O—Si bond in the second silicon oxide thin film being smaller than bond angle of Si—O—Si bond in the first silicon oxide thin film and the second silicon oxide thin film being more hydrophobic the first silicon oxide thin film;
   wherein the superficial layer of the second silicon oxide thin film being more hydrophobic than other remaining regions of the second silicon oxide thin film, and the other remaining regions of the second silicon oxide thin film being more hydrophobic than the first silicon oxide thin film;
   wherein the second silicon oxide thin film being thicker than the first silicon oxide thin film;
   wherein the first silicon oxide thin film having a thickness of 1000 Å, and the second silicon oxide thin film having a thickness of 2000 Å.

* * * * *